(12) United States Patent
Hartmann

(10) Patent No.: US 6,968,483 B2
(45) Date of Patent: Nov. 22, 2005

(54) CIRCUIT AND METHOD FOR TESTING A DATA MEMORY

(75) Inventor: Udo Hartmann, München (DE)

(73) Assignee: Infineon Technologies AG, Munich (DE)

(*) Notice: Subject to any disclaimer, the term of this patent is extended or adjusted under 35 U.S.C. 154(b) by 440 days.

(21) Appl. No.: 09/977,787

(22) Filed: Oct. 15, 2001

(65) Prior Publication Data

US 2002/0056062 A1      May 9, 2002

(30) Foreign Application Priority Data

Oct. 13, 2000 (DE) ............................... 100 50 771

(51) Int. Cl.[7] ............................................. G11C 29/00
(52) U.S. Cl. ..................................................... 714/719
(58) Field of Search ............................. 714/718, 719, 714/720, 722

(56) References Cited

U.S. PATENT DOCUMENTS

| | | | |
|---|---|---|---|
| 6,085,346 A | * | 7/2000 | Lepejian et al. ............ 714/733 |
| 6,195,771 B1 | | 2/2001 | Tanabe et al. |
| 6,477,673 B1 | * | 11/2002 | Ferrant et al. .............. 714/728 |
| 6,691,271 B1 | * | 2/2004 | Kanehira et al. ........... 714/736 |

FOREIGN PATENT DOCUMENTS

EP       EP 0 828 257 A2    3/1998

OTHER PUBLICATIONS

Tadahiko Sugibayashi et al,.: "A Distributive Serial Multi-Bit Parallel Test Scheme for Large Capacity DRAMs", IEICE Trans. Electron., vol. E77-C, No. 8, Aug. 1994, pp. 1323–1327.

* cited by examiner

*Primary Examiner*—Albert Decady
*Assistant Examiner*—John P. Trimmings
(74) *Attorney, Agent, or Firm*—Laurence A. Greenberg; Werner H. Stemer; Ralph E. Locher

(57) ABSTRACT

A data memory to be tested is connected to a processing unit. Data items to be stored are produced from a test pattern data item in the processing unit and are stored in the data memory. The data memory is tested in that the test pattern data items are received from a test device, processed using a first function to form data items to be stored, and the data items are then stored. After the stored data items are read from the memory they are processed with a second function to form test data items whose number is once more smaller than the stored data items that are read from the memory.

13 Claims, 1 Drawing Sheet

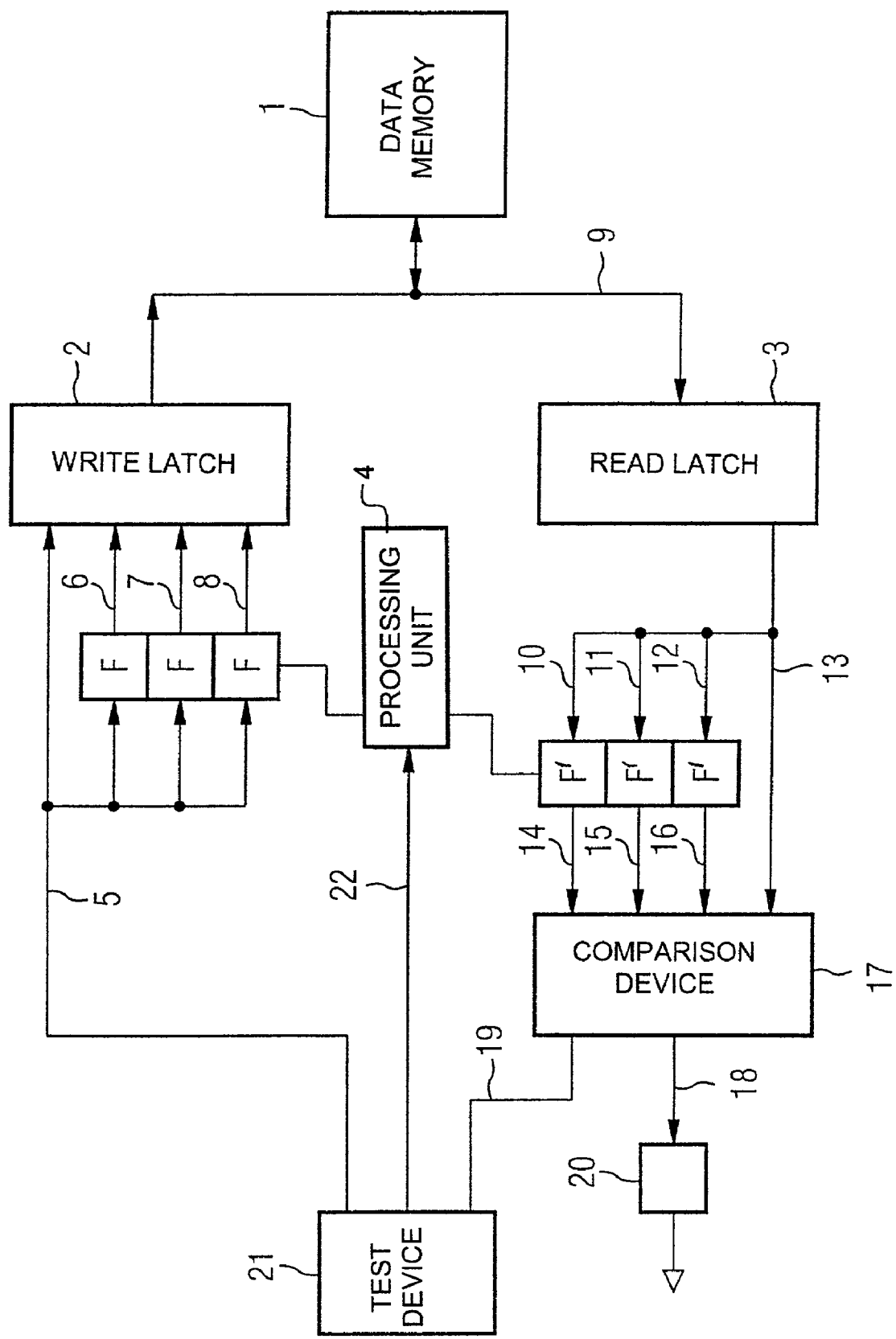

CIRCUIT AND METHOD FOR TESTING A DATA MEMORY

BACKGROUND OF THE INVENTION

Field of the Invention

The invention relates to a circuit and a method for testing a data memory.

In the testing of the functionality and serviceability of memories, test pattern data items are written to the memory, and the stored test pattern data items are then read to an external test device. In the external test device, the test pattern data items that have been read are compared with the stored test pattern data items in order to determine whether a memory cell or a memory area is defective. Such a test sequence is normally carried out a number of times using different test pattern data items, which are written to the memory in order to identify the various types of possible faults. In this case, the test pattern data items are chosen such that they take account of the physical characteristics of the memory, that is to say, in particular, coupling effects between adjacent lines and/or cells are tested by deliberately writing the same or different contents to them. This frequent writing and reading by the test device is highly time-consuming and then makes such a test method very costly.

In this case, the transmission of the test pattern data items to the memory module and the transmission of the test data items back, that is to say with the data items being read from the memory, represents a bottleneck for the test device.

The paper by Sugibayashi, Naritake, Tadaka (and others), entitled *A Distributive Serial Multi-Bit Parallel Test Scheme for Large Capacity DRAMs*, in: IEICE Trans. Electron., Vol. E77-C, No. 8 August 1994, pages 1323 et seq. discloses a data memory to which a test data item that is supplied is written a number of times to the memory to be tested, and the data items read back are supplied to a comparison device. The comparison device compares the data items read back from the memory to be tested and outputs a fault signal if the data items read back are not the same, with the data output being switched to a tristate mode in the event of a fault.

U.S. Pat. No. 6,195,771 B1 (European patent EP 0 828 257 A2) discloses a method and a device for testing a memory circuit in a semiconductor device. The test circuit uses test command data items to generate test pattern data items for the memory circuit.

SUMMARY OF THE INVENTION

It is accordingly an object of the invention to provide a method and a device for testing a memory circuit, which overcomes the above-mentioned disadvantages of the heretofore-known devices and methods of this general type and which improves the testing of a data memory, and in particular is enabled to speed up the process.

With the foregoing and other objects in view there is provided, in accordance with the invention, a circuit for testing a data memory, comprising:

a processing unit connected to the data memory, the processing unit applying a first function to a predetermined test pattern for generating therefrom data items to be written to the data memory, the processing unit reading the data items from the data memory and applying a second function to the data items read from the data memory for generating therefrom test data items;

wherein the second function is a reciprocal function of the first function and a number of the data items is greater than a number of test data items; and a test device connected to and outputting to the processing unit function data items defining the first function and the second function for the processing unit.

In accordance with an added feature of the invention, a number of the data items read from the data memory is greater than a number of the test data items generated therefrom. Alternatively, or in addition, the number of the data items generated from the test pattern for writing to the data memory is greater than a number of the test data items forming the test pattern.

With the above and other objects in view there is also provided, in accordance with the invention, a method of testing a data memory, which comprises the following steps:

receiving a predetermined test pattern data item;

processing the test pattern data item with a first function to produce data items for the data memory with a greater data width than the test pattern data item;

storing the data items in the data memory;

reading the stored data items from the data memory;

processing the stored data items with a second function being a reciprocal function of the first function, to produce test data items and to check a functionality of the data memory, and thereby defining the first function and the second function by function data items predetermined by a test device.

In other words, a circuit is provided for testing a data memory, with stored data items being written to the data memory in order to test the data memory. A processing unit is also provided, and is connected to the data memory. In the processing unit, stored data items, which are stored in the data memory, are produced from a test pattern data item which is supplied, for example, from an external test device. The processing unit is designed so as to read stored data items stored in the data memory and to produce test data items from the stored data items that have been read. The processing unit applies a first function to the test pattern data item, in order to produce the stored data items. A second function is applied to the stored data items that are read from the data memory, in order to produce the test data items. The second function is a reciprocal function of the first function, with the set of stored data items which are read to the processing unit being greater than the set of test data items which are produced from the stored data items in the processing unit. The first function and the second function are defined by function data items, which are predetermined for the processing unit by a test device.

This advantageously makes it possible to convert the test pattern data items in the circuit to stored data items, so that the set of stored data items which is stored in the data memory is greater than the set of test pattern data items which has been supplied to the processing unit. In this way, the circuit is used to reduce the load on the transmission path between the test device and the processing unit or data memory by virtue of the fact that fewer data items need be transmitted there, without reducing the fault coverage during testing of the data memory.

The processing unit is designed such that the stored data items stored in the data memory are read to the processing unit. In the process, test data items are produced in the processing unit from the stored data items. A comparison device, for example, can use these test data items to determine whether there is a fault in the data memory. Since the set of stored data items which are read to the processing unit may be greater than the test data items which are produced in the processing unit from the stored data items, the process of identifying a fault in the data memory from the test data items can be carried out more easily and in a less time-consuming manner than when using the stored data items.

Furthermore, the processing unit is provided such that a first function is carried out on the first pattern data items, and a second function is carried out to determine the test data items from the stored data items read in the data memory. In this case, the second function is preferably a reciprocal function of the first function, so that the test pattern data items are transformed to stored data items, and the stored data items are transformed to test data items, with the test pattern data items corresponding to the test data items if the data memory is operating correctly. This has the advantage that it is easily possible for a test device to determine whether there is a fault in the data memory, if the test pattern data items which it has sent to the data memory are not the same as the test data items which the processing unit determines from the stored data items.

The first and/or the second function in the processing unit are/is defined by function data items which are sent to the processing unit. This means that it is possible to process the test pattern data items in various ways during a test run in order thus to produce various types of stored data items as effectively as possible from the test pattern data items. This means that it is possible to use a respective suitable function to produce as many stored data items as possible, by means of which the data memory is tested, from a very small number of test pattern data items.

It is also possible to provide for the comparison device to be designed such that it receives a number of test data items from the processing unit and compares that number of test data items with one another in order to find any fault. If the test data items are determined using a reciprocal function with the stored data items produced from the test pattern data items by means of a function, the number of test data items must in each case be identical to one another and must each correspond to the original test pattern data items. This makes it very easy for the comparison device to identify a fault in the data memory, thus making it possible to reduce the load on the test device in the method for identifying a fault. Thus, according to the invention, it is possible for a test device to send test pattern data items to the circuit according to the invention, which circuit produces stored data items which are stored in the data memory to be tested, with the set of stored data items being greater than the set of test pattern data items. The stored data items are then read from the memory and are transformed back to test data items in the processing unit, with the test data items being compared with one another in the comparison device.

One preferred embodiment provides for the circuit according to the invention to be integrated as a memory module in an integrated circuit, which is preferably located together with the data memory to be tested on a common substrate. This makes it possible for a portion of the test in the memory module to be carried out with a test device during testing of the integrated circuit, and for the testing time to be considerably reduced owing to the reduction of the amount of data which must be transmitted to the memory module for testing and must be read from the memory module.

Other features which are considered as characteristic for the invention are set forth in the appended claims.

Although the invention is illustrated and described herein as embodied in a circuit for testing a data memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The FIGURE is a block diagram illustrating a test circuit according to the invention.

DESCRIPTION OF THE PREFERRED EMBODIMENTS

Referring now specifically to the sole FIGURE of the drawing, there is shown a block diagram of a circuit for testing a data memory 1. The data memory is written to by the write latch 2, and is read by a read latch 3. A processing unit 4 is also provided, which applies test pattern data items, which are present on a test data input line 5 connected to a test device 21, by means of a function F to three stored data item packets on the stored data lines 6, 7 and 8. The test pattern data items have a data width of eight bits, from which the processing unit 4 produces the three stored data item packets, each of which has 8 bits. Test pattern data items and the three stored data item packets are transferred as stored data items to the write latch 2, where they are provided for exclusive writing via a data bus 9 to the data memory 1.

The stored data items are produced from the test pattern data items using a function. The test pattern data items and the respective function are selected such that stored data items are produced from them which are suitable for optimally testing a memory. By way of example, the test pattern data items could have a logic "1" and a logic "0" alternately, and the function could carry out an inversion. This would allow what is referred to as a checkerboard pattern to be produced. Since the logical addresses in a memory area are not often allocated to memory cells arranged alongside one another, the function can be provided such that test pattern data items and the function for testing, for example, crosstalk effects between adjacent memory cells are selected so as to test the memory area to be tested for crosstalk between the signals from one memory cell to an adjacent memory cell.

The data bus 9 has four times the width of the original test pattern data items, namely 32 bits. In this way, stored data items are produced from test pattern data items in the test pattern data input line 5, with the amount of stored data items which are intended to be written via the write latch 2 to the data memory 1 being four times the original amount of test pattern data items. The data width of the test pattern data items and the multiplication factor can, of course, be adapted appropriately for the desired application.

The function carried out by the processing unit 4 is predetermined, for example, by the test device 21 by means of function data items via a function data line 22, and these are transmitted to the processing unit 4. It is thus possible to change the function of the processing unit 4 during a test sequence, by sending new function data items to the processing unit 4.

Once the stored data items produced in this way have been written to the data memory 1, the stored data items stored in the data memory 1 are read via the data bus 9 to the read latch 3. The stored data items which have been read and are located in the read latch 3 are now split into four stored data item packets (preferably of identical size) between the stored data lines 10, 11, 12 and 13, thus resulting in the formation of a set of four data packets, whose sizes correspond to the data items on the stored data lines 5, 6, 7 and 8. Each of these stored data lines 10, 11, 12 and 13 accordingly has a data width of 8 bits. The data items are read from the data memory 1 in such a way that the stored data item packet which is located on the stored data line 13 is that which has been written without being changed from the test data input line 5 via the write latch 2 to the data memory 1. The splitting of the stored data items or the data width of the test data items that are produced can, of course, be matched appropriately to the desired application.

The stored data item packets on the stored data lines 10, 11 and 12 are processed by the processing unit 4 using a further function F'. The further function F' is a reciprocal function of the function F by means of which the test pattern data items on the test data input line 5 were converted to stored data item packets on the stored data lines 6, 7 and 8. The further function F' makes it possible to convert those test pattern data items which were converted using the function F with the stored data items back to data items which are the same as the test pattern data items, provided there are no faults in the memory area to be tested, but which are not the same if a fault has occurred.

To do this, it is possible for the function data items which are sent to the processing unit 4 to be designed such that either the reciprocal function F' can be determined from them by the processing unit 4, with the function representing its own reciprocal function F', or such that the function data items have two algorithms, with a first algorithm using a function F to convert the test pattern data item to a stored data item, and a second algorithm carrying out the reverse conversion of the stored data item, using a reciprocal function F', to a test data item, so that each of the test data items corresponds to the test pattern data items if the storage process is working correctly.

When the stored data item packets on the stored data lines 10, 11 and 12 have been processed by the processing unit 4, the results are output as test data item packets on the test data lines 14, 15 and 16. As the result of the choice of the function which is carried out in the processing unit 4, the test data item packets on the three test data lines 10, 11 and 12 and on the stored data lines 13 must now be identical, provided that the stored data items have been stored without any faults in the data memory 1. Furthermore, when using the reciprocal function, they must be the same as the test pattern data items which were transmitted to the circuit initially.

The test data lines 14, 15 and 16 and the stored data line 13 are connected to a comparison device 17. The comparison device 17 compares the received test data item pockets with one another, and outputs a fault signal to a fault signal line 18 as soon as there is a difference between at least one of the received test data item packets and the others. In this way, it is possible for the circuit to determine whether there is a fault in the data memory 1, by checking whether the stored data items written to the data memory 1 are the same as the stored data items read from the data memory 1. If the comparison device 17 finds that the received test data item packets are the same as one another, one of the test data item packets is transmitted via the test data output line 19 to the test device 21.

The fault data line 18 is optionally connected to an OR gate 20, to whose other inputs the results of various further tests on the memory module are applied. An output of the OR gate 20 then emits a fault signal as soon as at least one of the tests has identified a fault in the memory module.

The described method according to the invention makes it possible, for example, for the test device to transmit test pattern data items whose size is one byte, as a result of which four stored data item packets, of one byte each, are generated, and these are stored in the data memory 1. In this way, only a quarter of the amount of data required as test pattern data items need be transmitted to the memory module when testing the data memory 1 as the amount of available memory space in the data memory 1. Conversely, the stored data items are read from the data memory 1, are converted in the processing unit 4 using the predetermined function, and are then compared with one another in the memory module, thus making it possible to detect a fault. If no fault is present, one of the test data item packets (which are identical to one another) is transmitted back to the test device so thaT the latter can determine whether any further systematic fault, which cannot be detected by the method according to the invention, is present, which cannot be identified by the comparison device 17.

It is obvious that, in this way, test pattern data items from a test device can be converted, using a processing unit 4 into any desired number of stored data items, as a result of which the set of test pattern data items which must be made available by a test device is considerably reduced. Since the time for testing a memory module depends to a considerable extent on the transmission of data items from the test device to the memory module or back again, this allows the testing time to be reduced considerably.

Since a large number of stored data items can be produced from a small number of test pattern data items in this way, it is feasible for the test pattern data items likewise to be stored in a memory additionally provided for this purpose in the memory module, and for the function which the processing unit 4 is intended to carry out likewise to be located in the memory module. This means that it is possible to completely dispense with the transmission of test pattern data items from a test device, and for the memory module to carry out a self-test, so that all that is necessary is for the fault data line 18 to tell the test device whether the memory module is or is not faulty.

The features of the invention disclosed in the above description, the claims and the drawing may be significant to the implementation of the various embodiments of the invention both individually and in any combination.

I claim:

1. A circuit for testing a data memory, comprising:
a processing unit connected to the data memory, said processing unit configured for:
applying a first function to a predetermined test pattern for generating therefrom data items to be written to the data memory;
reading the data items from the data memory and applying a second function to the data items read from the data memory for generating therefrom test data items, the second function being a reciprocal function of the first function and a number of the data items being greater than a number of test data items;
a test device connected to and outputting to said processing unit function data items defining the first function and the second function for said processing unit; and
a comparison device:
being connected to said processing unit and to said data memory;
receiving test data from the data memory; and determining if the data memory is faulty based upon a comparison of the test data items produced by said processing unit with each other and with the predetermined test pattern upon which the first function has not been applied.

2. The circuit according to claim 1, wherein a number of the data items read from the data memory is greater than a number of the test data items generated therefrom.

3. The circuit according to claim 1, wherein a number of the data items generated from the test pattern for writing to the data memory is greater than a number of the test data items forming the test pattern.

4. The circuit according to claim 1, wherein said comparison device outputs a fault signal as soon as a difference exists between the test data items produced by said processing device and the stored data items read from the data memory.

5. The circuit according to claim 1, which comprises a buffer store connected between said processing unit and the data memory, for intermediately storing the data items produced from the predetermined test pattern and writing to the data memory.

6. The circuit according to claim 1, which comprises a buffer store connected between said processing unit and the data memory, for intermediately storing the data items read from the data memory and forwarding the data items for processing in said processing unit.

7. The circuit according to claim 1, which comprises a first buffer store connected between said processing unit and the data memory, for intermediately storing the data items produced from the predetermined test pattern and writing to the data memory, and a second buffer store connected between said processing unit and the data memory, for intermediately storing the data items read from the data memory and forwarding the data items for processing in said processing unit.

8. The circuit according to claim 1 commonly integrated in a memory module together with the data memory.

9. A method of testing a data memory, which comprises the following steps:

receiving a predetermined test pattern data item;

processing the test pattern data item with a first function to produce data items for the data memory with a greater data width than the test pattern data item;

storing the data items in the data memory;

reading the stored data items from the data memory;

processing the stored data items with a second function being a reciprocal function of the first function, to produce test data items, and thereby defining the first function and the second function by function data items predetermined by a test device; and detecting a fault in the data memory by comparing the test data items with one another and with the predetermined test pattern data item upon which the first function was not applied.

10. The method according to claim 9, which comprises checking a functionality of the data memory by comparing the test data items and the stored data items read from the data memory.

11. The method according to claim 9, which comprises using the predetermined test pattern data item as a stored data item for the data memory.

12. The method according to claim 9, which comprises storing the data items at one address in the data memory.

13. The method according to claim 9, which comprises reading the stored data items from one address in the data memory.

* * * * *